United States Patent [19]

Piper et al.

[11] Patent Number: 4,682,828
[45] Date of Patent: Jul. 28, 1987

[54] BUS BAR BRIDGED PC BOARD FOR TRANSITIONAL TERMINATION OF MULTIPLE CABLES AND METHOD

[75] Inventors: Douglas E. Piper, Greenville; Michael D. Black, Mauldin, both of S.C.

[73] Assignee: 501 Woven Electronics Corporation, Mauldin, S.C.

[21] Appl. No.: 806,347

[22] Filed: Dec. 6, 1985

[51] Int. Cl.[4] .............................................. H01F 4/66
[52] U.S. Cl. ........................................ 439/92; 29/857; 29/860; 29/861; 439/77; 439/497; 439/493
[58] Field of Search ............... 339/17 F, 17 L, 17 LC, 339/14 R, 176 MF; 29/857–867

[56] References Cited

U.S. PATENT DOCUMENTS 2,964,587 12/1960 Minot ................................. 339/17 F
3,356,983 12/1967 Johnson, Jr. ...................... 339/14 R
3,973,817 8/1976 Stalley et al. ..................... 339/14 R

OTHER PUBLICATIONS

Abbatecola, R. et al., IBM Technical Disclosure Bulletin, vol. 10, No. 10, Mar. 1968.

Primary Examiner—Percy W. Echols
Attorney, Agent, or Firm—Cort Flint

[57] ABSTRACT

A transitional printed circuit board (10) is disclosed for terminating four multiconductor flat electrical transmission cables (44, 46, 48, 50) wherein only a single substrate (12) is utilized. A first electrical plane (A) is formed on one side of the substrate and a second electrical plane (B) is formed on an opposing side of the substrate with the substrate material in between serving as an insulator. Each electrical plane includes a ground plane (26, 41) and spaced electrical lands (14, 16, 32, 34). Plated through holes (24) allow the lands from opposing sides to be connected to the opposite side for programmed termination. A series of electrical pads (22, 42) provide for termination to the prongs (52a, 52b) of terminal connector (52). Two cables may be terminated on each electrical plane of the printed circuit board by terminating ground wires of the first cable to the ground plane (26, 41), and the signal wires to the electrical lands (14, 32). The next electrical cable is terminated by connecting signal wires to lands (16, 34). The ground wires of the second cable on each electrical plane are terminated at a bus bar bridge (28, 43) which spans electrical traces (18, 36) which interconnect spaced rows of lands.

16 Claims, 4 Drawing Figures

といった4,682,828

BUS BAR BRIDGED PC BOARD FOR TRANSITIONAL TERMINATION OF MULTIPLE CABLES AND METHOD

BACKGROUND OF THE INVENTION

The invention relates to the transitional termination of a plurality of multiconductor cables in a single terminal connector. More particularly, the invention relates to the transition and termination of four individual electrical transmission cables into a single pin-socket connector by utilizing a bus bridge on a single substrate bar printed circuit board which eliminates the need for a multilayered printed circuit board.

Heretofore, in order to terminate four multiconductor cables into a single terminal connector, it has been necessary to utilize a printed circuit board constructed in at least three layers. Multiple levels of interconnect must be made through the layers in order to terminate and route the various signal and ground conductors from the four cables without shorting and signal interference. This process and construction is both expensive and time consuming in manufacturing and assembly.

Circuit boards have been generally known which employ conductive strips which straddle the circuit board for special purposes such as shown in U.S. Pat. No. 4,314,312 wherein a programmed insulator is placed between the contacts of the conductive strip and the circuit board to provide a selected circuit pattern.

SUMMARY OF THE INVENTION

The above objectives are accomplished according to the present invention by providing a transitional printed circuit board which includes first and second electrical planes on opposing sides of an insulating substrate. Each electrical plane includes a first ground plane adjacent a rear edge of the circuit board, and first electrical lands spaced from the first ground plane. Second electrical lands are spaced from the first electrical lands. Electrical traces interconnect the first and second lands. A ground bus bar bridge spans the electrical traces in a nonconductive manner. A series of electrical termination pads interconnect with the first and second electrical lands with a terminal connector. A first cable is terminated on the first electrical plane by connecting signal wires from the first cable to the first electrical lands, and connecting ground wires of the first cable at the first ground plane. A second cable is terminated on the first electrical plane by connecting signal wires from the second cable to the second lands, and connecting ground wires of the second cable to the second ground plane. A third cable is terminated on the second electrical plane by terminating signal wires of the third cable at the first electrical lands on the second electrical plane of the transitional circuit board. The ground wires of the third cable are terminated at the first ground plane on the second plane. A fourth cable is terminated by connecting signal wires of the fourth cable at the second electrical lands on the second electrical plane of the transitional printed circuit board, and terminating ground wires of the fourth cable at ground bus bar bridges.

DESCRIPTION OF THE DRAWINGS

The construction designed to carry out the invention will hereinafter be described, together with other features thereof.

The invention will be more readily understood from a reading of the following specification and by reference to the accompanying drawings forming a part thereof, wherein an example of the invention is shown and wherein.

DESCRIPTION OF A PREFERRED EMBODIMENT

Figure 1:
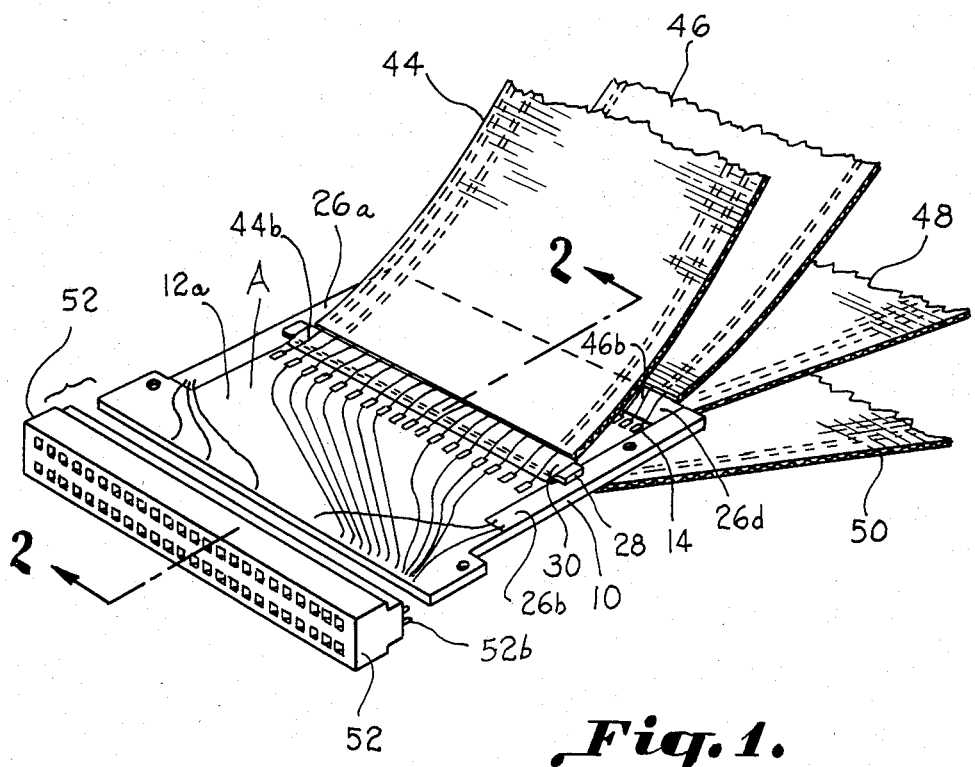
FIG. 1 is a perspective view illustrating a transitional terminal printed circuit board for transitioning and terminating four multiconductor flat electrical transmission cables in accordance with the present invention.

Referring now to the drawings, the invention is illustrated wherein a printed circuit (PC) board is illustrated generally at 10 which includes a substrate 12. The substrate of the PC board includes two sides 12a and 12b. Side 12a includes a first electrical plane or layer A for transitionally terminating two flat woven electrical transmission cables into a pin-socket terminal connector. Side 12b includes a second electrical plane or layer B for transitionally terminating two additional flat woven electrical transmission cables into a pin-socket terminal connector in a manner to be explained more fully in detail hereinafter. While the PC board may be utilized with only two cables terminating on only one side of the PC board, it is in making transition of four cables into a terminal connector that the invention is most particularly advantageous.

Figure 3:
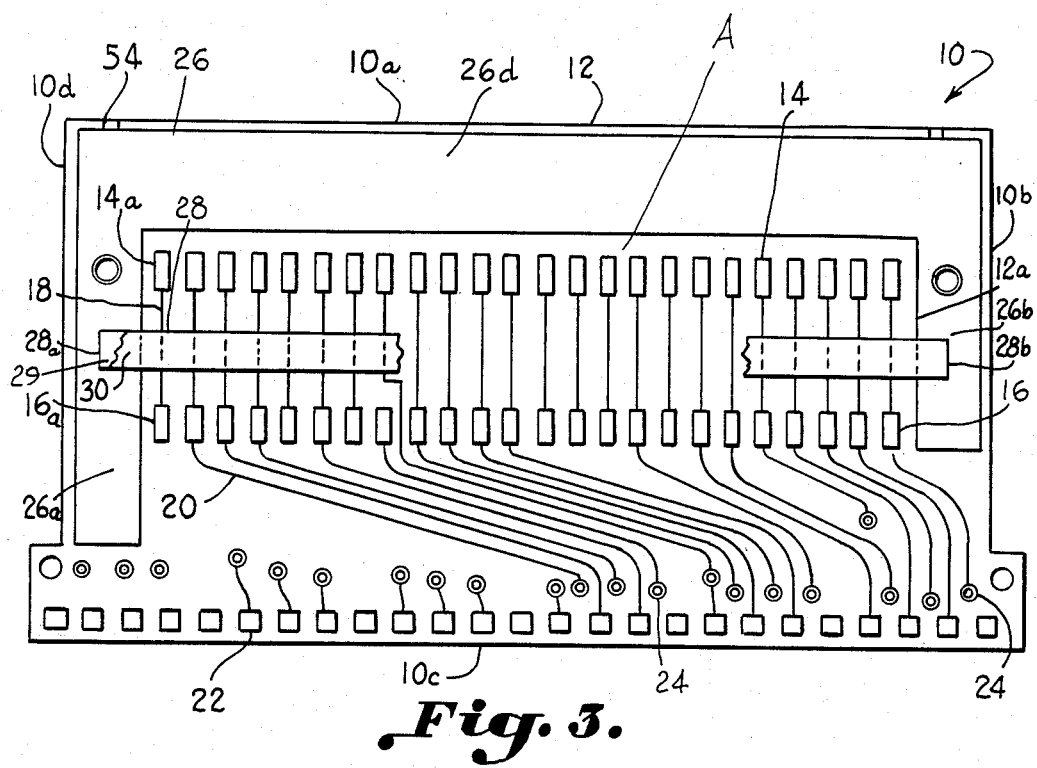
FIG. 3 is a top plan view illustrating a first electrical plane of a transitional printed circuit board for terminating a plurality of multiconductor transmission cables in accordance with the present invention.

As can best be seen in FIG. 3, the first side 12a of substrate 12 includes a first electrical plane A which includes first and second electrical contact means in the form of a plurality of electrically conductive lands 14, and a second plurality of electrically conductive lands 16 which are spaced form lands 14 and interconnected by a plurality of electrical traces 18. Lands 14 and 16 are arranged in spaced rows 14a, 16a. Electrical termination means includes a series of termination pads 22 which are connected to lands 16 by electrical traces 20. A series of plated-through holes 24 are formed through the substrate 12 in a manner that some of traces 20 may be programmed to terminate at opposite side 12b of PC board 10.

First electrical plane A on side 12a of substrate 12 includes a generally U-shaped ground plane 26 having a first ground plane section 26a formed as a leg along peripheral edge 10d of PC board 10, and a second ground plane section 26b formed as a leg along peripheral edge 10b. An interconnecting ground plane section 26d extends along peripheral edge 10a of PC board 10 and interconnects the ground sections 26a and 26b.

Figure 2:
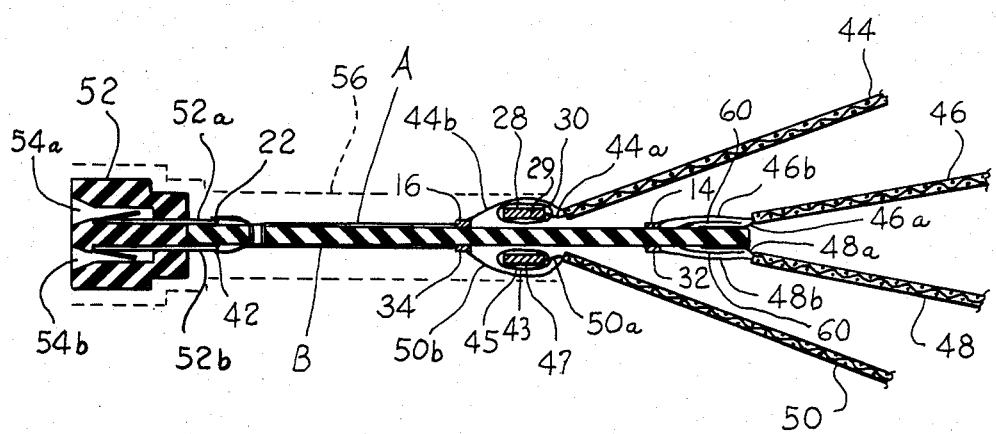
FIG. 2 is a section view taken along line 2—2 of FIG. 1.

A second ground plane in the form of a bus bar bridge 28 spans electrical traces 18 in a superposed position in a manner that electrical signals transmitted along traces 18 are not shorted by a grounded bus bar 29 forming part of the bridge. Bus bar bridge 28 is connected at end 28a to ground section 26a and at end 28b to ground plane section 26b. A layer of insulation 30, preferably in the form of a tape, surrounds the conductive bus bar 29 of the bus bar bridge 28. The insulation insulates traces 18 of the PC board below and the signal wires which may pass over the bus bar 29 (FIGS. 1 and 2).

Figure 4:
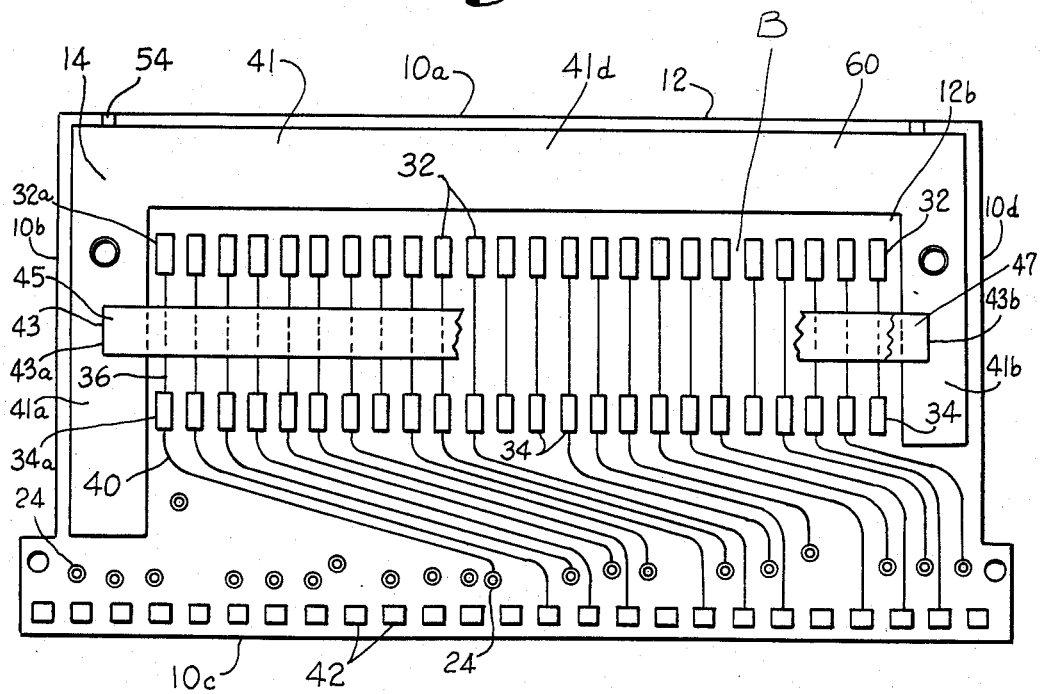
FIG. 4 is a plan view of an opposite side of the printed circuit board of FIG. 3 illustrating a second electrical plane for terminating a plurality of multiconductor transmission cables.

As can best be seen in FIG. 4, second electrical plane B is defined on side 12b of the PC board 10 which includes first and second electrical contact means in the form of a first plurality of electrically conductive lands 32, and a second plurality of electrically conductive lands 34. Lands 32 are spaced from lands 34 and are interconnected by electrical traces 36. Lands 32 and 34 are arranged in respective spaced rows 32a and 34a. There exists plated through holes 24 in the second electrical plane B to which the desired ones of traces 40 may be connected.

Electrical termination means for connecting lands 32 and 34 to the terminal connector includes a series of termination pads 42 which connect directly to the prongs of the pin sockets of the terminal connector 52. Plated through holes 24 may be programmed to connect traces 20 or 40 to opposing sides.

There is a ground plane 41 formed on side 12b of substrate 12 in the form of a generally U-shaped ground plane around the peripheral edges of PC board 10 coextending with ground plane 26. Ground plane 41 includes a first ground plane section 41a extending along peripheral edge 10b, and a second ground plane section 41b extending as a leg along peripheral edge 10d. There is a third ground plane section 41d interconnecting legs 41a and 41b extending along rearward edge 10a of PC board 10 (FIG. 4).

Referring to FIGS. 2 and 4, there is a second ground plane provided in the second electrical plane B by a bus bar bridge 43 which spans electrical traces 36 to prevent shorting of signals transmitted to traces 36. Bus bar bridge 43 is terminated at ends 43a and 43b to ground plane sections 41a and 41b, respectively. A layer of insulation 45 surrounds bus bar 47 of bus bar bridge 43.

The electrically conductive lands and traces and terminating pads may be formed on opposing sides of the substrate in any conventional manner. For example, a laminated layer of copper may be etched and removed to create the small electrical areas of lands, traces, pads and ground planes forming electrical planes A and B on opposing sides of substrate 12 (FIGS. 3 and 4).

In accordance with transitional terminal PC board 10 of the present invention, as can best be seen in FIG. 1, there is a first cable 44, a second cable 46, a third cable 48, and a fourth cable 50 which are all transitionally terminated and connected to a single terminal connector 52. The transition of the cables to the connector is made by means of the aforedescribed electrical planes. Each of the cables is illustrated in the form of a woven electrical transmission cable having a plurality of signal conductors and ground conductors arranged juxtaposed and bound in a weave pattern in a conventional manner.

The ground wires 44a from first cable 44 are terminated at a bus bar bridge 28, and signals 44b from cable 44 are terminated at the lands 16. Ground wires 46a from second cable 46 are terminated at ground plane section 26d, and signal wires 46b are terminated at lands 14. Bus bar bridge 28 spans above traces 18 in a manner not to short out signals from cable 46.

In accordance with the invention, the bus bar bridges 28 and 43 are connected to a common ground with ground planes 26 and 41 via wrap-around pigtail connectors 54.

Ground signals 50a of cable 50 are terminated at bus bar bridge 43, and signal wires 50b of cable 10 are terminated at lands 34. Ground wires 48a of cable 48 are terminated at ground plane section 41d, and signal wires 48b at lands 32. Bus bar bridge 43 spans above traces 36 in a manner that signals 50b are not shorted.

Electrical traces 20 connected to lands 16 in the first electrical plane may be connected to desired ones of the pads 22 or plated holes 24 in accordance with a prescribed program for termination to electrical connector 52. Likewise, traces 40 connected to lands 34 in the second electrical plane are routed either to a pad 42 or plated-through holes 24 in accordance with the prescribed termination program. Plated through holes 24 may be utilized to terminate conductors in one electrical plane to the pads in the opposite electrical plane. Connector 52 includes prongs 52a and 52b electrically connected to pads 22 and 42, respectively, such as by soldering. Prongs 52a and 52b are connected to pin sockets 54a and 54b of terminal connector 52. A cover 56 may be fastened about the transitionally terminated cables and PC board as shown in dotted lines.

There is electrical insulation 60 arranged between signal wires 46b of cables 46 and ground plane 26. Insulation 60 also insulates signal wires 48b and ground plane 41, and may be any suitable electrical insulation tape. Thus, it can be seen that an advantageous simplistic construction can be had for a transitional PC board for terminating four individual woven flat electrical transmission cables in accordance with the invention. The need for a multilayered circuit board with various levels of interconnect requiring complexity in construction and in connecting the four cables is eliminated.

While a preferred embodiment of the invention has been described using specific terms, such description is for illustrative purposes only, and it is to be understood that changes and variations may be made without departing from the spirit or scope of the following claims.

What is claimed is:

1. A transitional printed circuit board for transitionally terminating four electrical transmission cables into a terminal connector, each of said cables including a plurality of ground wires and a plurality of signal wires, said transitional printed circuit board comprising;

a nonconductive substrate;
a first electrical plane formed on a first side of said substrate;
a second electrical plane formed on a second side of said substrate opposite the first side of said substrate, said substrate intermediate said first and second electrical planes forming an insulation layer between said electrical planes;
said first electrical plane including:
a generally U-shaped ground plane formed around peripheral edges of said substrate including a first ground plane section formed along a first peripheral edge, a second ground plane section formed along a second peripheral edge opposite said first peripheral edge, and a third ground plane section joining said first and second ground plane sections along a rear peripheral edge of said substrate;
a first plurality of spaced electrically conductive lands in said first electrical plane spaced between said first and second ground plane sections;
a second plurality of spaced electrically conductive lands included in said first electrical plane spaced forward of said first plurality of lands toward a connector edge of said printed circuit board;

electrical trace means connecting said first and second plurality of electrically conductive lands in a desired pattern;

a bus bar bridge including a ground bus bar spanning said electrical trace means in a manner in which said bus bar is out of electrical contact with said trace means to prevent shorting of electrical signals;

a series of electrically conductive pads for making connection to a terminal connector disposed adjacent said connector edge of said printed circuit board; and a second plurality of electrical trace means connecting said second plurality of lands and said series of pads in a desired pattern for programmed termination; and said second electrical plane including:

a generally U-shaped ground plane formed around peripheral edges of said substrate coextending generally with said ground plane of said first electrical plane including a first ground plane section formed along a first peripheral edge, a second ground plane section formed along a second peripheral edge opposite said first peripheral edge, and a third ground plane section joining said first and second ground plane sections along a rear peripheral edge of said substrate;

a first plurality of spaced electrically conductive lands in said second electrical lane spaced between said first and second ground plane sections;

a second plurality of spaced electrically conductive lands included in said second electrical plane forward of said first plurality of lands toward said connector side of said printed circuit board;

electrical trace means connecting said first and second plurality of electrically conductive lands of said second electrical plane in a desired pattern;

a bus bar bridge including a ground bus bar spanning said electrical trace means in said second electrical plane in a manner in which said bus bar is out of electrical contact with said trace means to prevent shorting of electrical signals;

a series of electrically conductive pads included in said second electrical plane for making connection to a terminal connector disposed adjacent said connector side of said printed circuit board; and a second plurality of electrical trace means connecting said second plurality of lands and said series of pads in a desired pattern for programmed termination;

a series of plated through holes formed in said substrate between said first and second electrical planes, a number of said plated through holes being connected to the lands of one of said electrical planes and to the termination pads of the other of said electrical planes.

2. The device of claim 1 wherein said bus bar bridge includes insulation means disposed between said bus bar and substrate, and opposed ends of said bus bar being electrically connected to said first and second ground plane sections.

3. The device of claim 2 wherein said insulation means includes a layer of insulation covering the top and bottom of said bus bar with said opposing ends being exposed for connection to said ground sections, said top insulation layer adapted for insulating signal wires passing over said bus bar.

4. The device of claim 1 wherein said first and second ground planes and bus bar bridges are interconnected to a common ground.

5. The device of claim 4 including means for electrically interconnecting said ground planes of said first and second electrical planes.

6. A transitional printed circuit board for transitionally terminating a plurality of electrical transmission cables, each of which includes a plurality of ground and signal wires comprising:

a nonconductive electrical substrate;

said substrate having a connector end adapted for receiving a terminal connector, an opposed rear end, a first side integral with said connector and rear ends, and a second opposing side integral with said connector and rear ends;

a first ground plane formed on one side of said substrate adjacent the periphery of said substrate;

first electrical contact means for making electrical connection with the signal wires of a first electrical transmission cable;

second electrical contact means for making connection with the signal wires of a second electrical transmission cable;

electrical trace means interconnecting said first and second electrical contact means;

a plurality of electrical pads disposed across said substrate adjacent said connector end;

a second ground plane superimposed above said electrical trace means generally parallel to said substrate in a manner that shorting of electrical signals transmitted along said electrical trace means is effectively prevented.

electrical termination means formed on said substrate adjacent said connector end adapted for connection to said terminal connector; and electrical trace means connecting said second land means and said electrical termination means.

7. The device of claim 6 wherein said first and second electrical contact means includes spaced electrically conductive lands formed across said substrate in a row, said lands being spaced both laterally and longitudinally on said substrate with said electrical trace means interconnecting said lands across said longitudinal spacing.

8. The device of claim 7 wherein said second ground plane means includes a bus bar bridge havng a bus bar disposed in a plane generally parallel to said first electrical plane bridged above and out of electrical contact with said electrical trace means to prevent shorting of signals, said bus bar having opposed ends connected to said first ground plane, and insulation, disposed between said bridged bus bar and said first electrical plane.

9. The device of claim 8 wherein said insulation includes an insulation layer wrapped around said bus bar.

10. A transitional printed circuit board for transitionally terminating four generally flat electrical transmission cables each of which includes a plurality of signal wires and ground wires, said transitional printed circuit board comprising:

a non-conductive electrical substrate;

a first electrical plane formed on first side of said substrate and a second electrical plane formed on a second side of said substrate, said substrate intermediate said first and second electrical planes serving to insulate said second plane;

a first ground plane formed in said first electrical plane about a periphery of said substrate for making connection to a first electrical cable;

first electrical land means formed in said first electrical plane for making electrical connection with signal wires of said first electrical transmission cable;

second electrical land means spaced from said first electrical land means for making connection with the signal wires of a second electrical transmission cable;

first electrical trace means interconnecting said first and said second electrical land means in said first electrical plane;

a first bus bar bridge including a bus bar spanning said first electrical trace means and bridging said first electrical plane for making connection to said first transmission cable;

said second electrical plane formed on said second side of said substrate including a first ground plane about a periphery of said substrate for making electrical connection with a third electrical cable;

first electrical land means formed on said second electrical plane for making electrical connection with signal wires of said third electrical transmission cable;

second electrical land means formed in said second electrical plane spaced from said first plurality of electrical land means for making electrical connection with a fourth electrical transmission cable;

second electrical trace means interconnecting said first and second electrical land means in said second electrical plane;

a second bus bar bridge spanning said second electrical plane including a bus bar spanning said second electrical trace means and bridging said second electrical plane generally out of contact with said second electrical trace means for making electrical connection to said fourth transmission cable; and electrical termination means for electrically connecting said first and second plurality of electrical lands of said first and second electrical plane to said terminal connector.

11. The device of claim 10 including insulation interposed between said bus bar and said electrical trace means of said first electrical plane, and between said bus bar and said signal wires of said second electrical transmission cable;

12. The device of claim 11 including electrical insulation disposed between said signal wires of said first and fourth cables and said first ground plane of said first and second electrical planes.

13. A method for transitionally terminating four layers of electrical transmission cable into a single terminal connector wherein each layer includes a plurality of signal wires and ground wires, said method comprising:
providing a transitional printed circuit board which includes first and second sides with an insulating substrated intermediate said sides wherein each said side includes;
a first ground plane adjacent a rear edge of said circuit board,
first electrical land means spaced from said first ground plane,
second electrical land means spaced from said first electrical land means,
electrical trace means interconnecting said first and second land means,
a second ground plane superimposed above said electrical trace means out of electrical contact therewith, and electrical termination means for connecting said first and second electrical land means and said first and second ground planes to said terminal connector, terminating a first cable on said first side by connecting signal wires from said first cable to said first electrical land means, and connecting ground wires of said first cable at said first ground plane;

terminating a second cable on said first side by connecting signal wires from said second cable to said second land means, and connecting ground wires of said second cable to said second ground plane;

terminating a third cable on said second side by terminating signal wires of said third cable at said first electrical land means on said second side of said transitional circuit board and the ground wires of said third cable at said first ground plane on said second side; and terminating a fourth cable on said second side by terminating signal wires of said fourth cable at said second electrical land means on said second side of said transitional printed circuit board and terminating ground wires of said fourth cable at said second ground plane on said second side.

14. The method of claim 13 wherein said second ground plane on each side of said transitional printed circuit board is provided by a bus bar bridge which includes a bus bar spanning above said electrical trace means, and insulating said bus bar and said electrical trace means and said signal wires coming from said second and fourth cables which pass over said bus bar bridges on said first and second sides of said printed circuit board.

15. The method of claim 14 including providing a insulation layer between said signal wires of said first cable and said first ground plane and between said signal wires of said third cable and said first ground plane.

16. A method of transitionally terminating four layers of electrical transmission cable into a single terminal connector wherein each layer includes a plurality of signal wires and ground wires, said method comprising:
providing a nonconductive substrate;
providing a first ground plane on a first side of said substrate;
forming a second ground plane on a second, opposite side of said substrate;
forming a first electrical plane on said first side of said substrate;
forming a second electrical plane on said second side of said substrate with the substrate in between said first and second electrical planes insulating between said planes;
terminating a first of said cable layers by connecting the ground wires to said first ground plane and the signal wires on said first electrical plane;
terminating a second of said cable layers by connecting the signal wires on said first electrical plane and terminating the ground wires of said second cable layer at a bus bar which bridges said said first electrical plane in a manner in which electrical contact is made only with said first ground plane;
terminating a third of said cable layers by connecting the ground wires to said second ground plane and the signal wires to said second electrical plane; and
terminating a fourth of said cable layers by connecting the signal wires to said second electrical plane and terminating the ground wires of said fourth cable layer at a bus bar bridging said second electrical plane in a manner in which electrical contact is made only with said first ground plane.

* * * * *